(12) United States Patent
Ozawa

(10) Patent No.: US 7,438,996 B2
(45) Date of Patent: Oct. 21, 2008

(54) MASK CORRECTING METHOD

(75) Inventor: Ken Ozawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 604 days.

(21) Appl. No.: 10/511,079

(22) PCT Filed: Dec. 19, 2003

(86) PCT No.: PCT/JP03/16343

§ 371 (c)(1),
(2), (4) Date: Oct. 12, 2004

(87) PCT Pub. No.: WO2004/072735

PCT Pub. Date: Aug. 26, 2004

(65) Prior Publication Data

US 2005/0164095 A1    Jul. 28, 2005

(30) Foreign Application Priority Data

Feb. 17, 2003   (JP)  .............................. 2003-037699

(51) Int. Cl.
G03F 1/00    (2006.01)
(52) U.S. Cl. .......................................................... 430/5
(58) Field of Classification Search ..................... 430/5, 430/394; 716/19–21
See application file for complete search history.

(56) References Cited

U.S. PATENT DOCUMENTS 6,420,077 B1 *  7/2002  Chen et al. ..................... 430/30
6,821,683 B2 *  11/2004  Toyama et al. ................. 430/5
6,928,636 B2 *  8/2005  Ohnuma ....................... 716/21

FOREIGN PATENT DOCUMENTS

JP       6-19115       1/1994
JP       10-78646      3/1998

* cited by examiner

*Primary Examiner*—Stephen Rosasco
(74) *Attorney, Agent, or Firm*—Robert J. Depke; Rockey, Depke & Lyons, LLC

(57) ABSTRACT

There is provided a method for correcting a photo mask, which allows the difference between a test mask and a corrected mask with respect to an error of line width depending on coarse/dense pattern to be decreased when the photo masks are corrected by optical proximity effect correction.

The present method is consisted of: producing a test mask which acts as a mask for extracting process model for applying an optical proximity effect correction method (s1); transferring and measuring the dimensions of the transferred pattern using the test mask (s2 and s3); obtaining a function model (referred to as process model) of which a simulated result of the transferred pattern of a mask pattern of the photo mask using a function model matches the measured result (s4); obtaining a mask pattern of which a transferred pattern matches a designed pattern using said process model and creating mask data in accordance with the obtained mask pattern (s5); producing a corrected mask in accordance with the created mask data (s5); and setting an exposing condition where an OPE characteristic becomes flat with respect of wide and narrow pitches by adjusting at least one of a numerical aperture (NA) and a coherence factor (σ) of an exposing device when the corrected mask is transferred.

4 Claims, 9 Drawing Sheets

| DIMENSIONAL ERROR OF COARSE/DENSE MASK (ON W) | CALCULATED CORRECTED VALUE OF MASK | DIMENSIONS OF CORRECTED MASK (WHEN ERROR DEPENDING ON COARSE/DENSE IS REPRODUCED) | CD ERROR OF WAFER CD WHEN CORRECTED MASK IS TRANSFERRED |
|---|---|---|---|
| -6 | 132 | 126 | -2.2 |
| -4 | 130 | 126 | -2.2 |
| -2 | 128.5 | 126.5 | -1.2 |
| 0 | 127 | 127 | 0 |
| 2 | 125.5 | 127.5 | 0.8 |
| 4 | 124.5 | 128.5 | 2.9 |
| 8 | 123.5 | 131.5 | 9.2 |

ERROR OF LINE WIDTH DEPENDING ON
COARSE/DENSE PATTERN OF TEST MASK (nm)
∗ON WAFER

| DIMENSIONAL ERROR OF COARSE/DENSE MASK (ON W) | CALCULATED CORRECTED VALUE OF MASK | DIMENSIONS OF CORRECTED MASK (WHEN ERROR DEPENDING ON COARSE/DENSE IS REPRODUCED) | CD ERROR OF WAFER CD WHEN CORRECTED MASK IS TRANSFERRED |
|---|---|---|---|
| −6 | 132 | 126 | −2.2 |
| −4 | 130 | 126 | −2.2 |
| −2 | 128.5 | 126.5 | −1.2 |
| 0 | 127 | 127 | 0 |
| 2 | 125.5 | 127.5 | 0.8 |
| 4 | 124.5 | 128.5 | 2.9 |
| 8 | 123.5 | 131.5 | 9.2 |

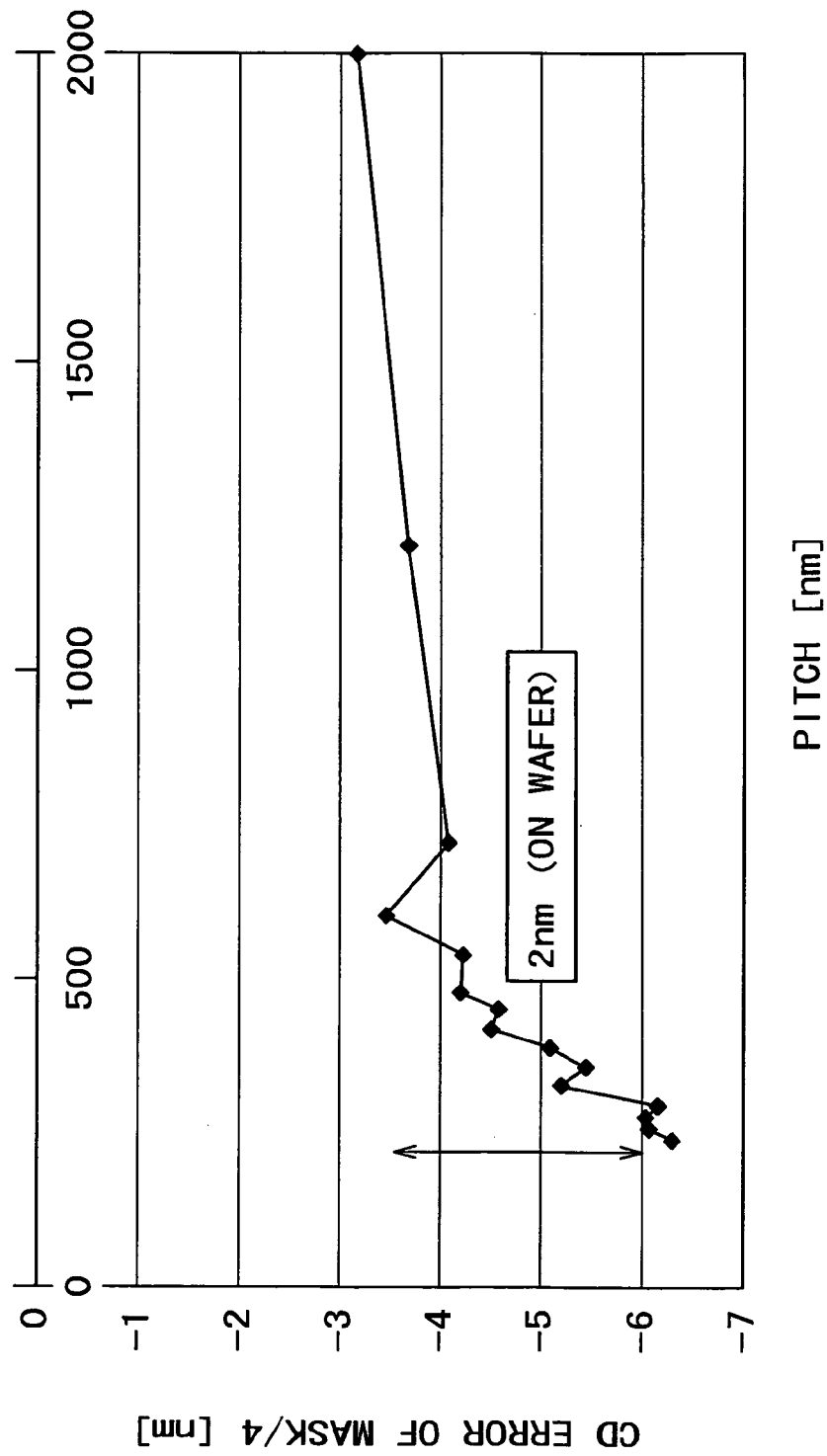

MASK CORRECTING METHOD

This application claims priority to Japanese Patent Application No. JP2003-037699, filed Feb. 17, 2003 which is incorporated herein by reference.

TECHNICAL FIELD

The present invention relates to a method for correcting a photo mask using an optical proximity correction (OPC) method, in particular, to a mask correcting method for removing as much difference between a test mask and a corrected mask with respect to an error of line width depending on coarse/dense pattern.

BACKGROUND ART

As a semiconductor device is being miniaturized and highly integrated, a circuit pattern thereof is being miniaturized. As a circuit pattern is becoming miniaturized, in an optical lithography process for patterning a semiconductor device, required resolution is becoming high. As a result, NA of a projection optical system of an exposing device is becoming large. The wavelength of an exposing light source is becoming short.

The resolution (R) in the optical lithography is expressed by the following Rayleigh's formula.

$$R = k1 \times \{\lambda/(NA)\} \quad (1)$$

where $\lambda$ represents the wavelength of exposure light; NA represents the numerical aperture of the exposing device; k1 represents a constant that depends on the condition and so forth of the optical lithography.

As the required resolution (R) is becoming high, since the k1 factor is becoming low, it becomes difficult to obtain the desired resolution.

In addition, as the performance and integration of a semiconductor device are becoming high in recent years, the required resolution is becoming high. As a result, an optical lithography in a region of which k1 is small, namely low-k1 lithography is performed.

In the low-k1 lithography, the mask production error of a photo mask largely affects the line width of a pattern (hereinafter referred to as critical dimension (CD)) of a transferred pattern transferred to a wafer.

Thus, in the low-k1 lithography, an inclined light is used for an exposing device. A phase shift mask is used as a photo mask. In addition, an OPC (Optical—Proximity Effect Correction) that bias-corrects the dimensions and shape of a mask and deforms the mask is used so as to correct the optical proximity effect.

In the OPC correction, as will be described later, a process model is extracted from a transferred result of a process model extracting mask. A mask corrected value is obtained in accordance with the process model. A corrected mask is produced in accordance with the obtained mask correction value.

As a factor that represents the emphasis rate of the influence of the pattern dimensional error of a photo mask (mask CD error) to the dimensional error of a transferred pattern transferred on a wafer (wafer CD error), an MEF (Mask Error Enhancement Factor) expressed by the following formula (2) is generally used.

$$MEF = \text{wafer CD error}/(\text{mask CD error}/M) \quad (2)$$

where M represents a reduction projection magnification of an exposing device. M is typically 5 or 4 for an exposing device used for producing a semiconductor device.

In the low-k1 lithography used in recent years, the MEF calculated by the formula (2) for a critical pattern may become 2 to 3. In other words, in the low-k1 lithograph, the dimensional error of a pattern of a photo mask largely impacts the dimensions of a transferred pattern transferred to a wafer. Thus, the influence of the dimensional error of a pattern of a photo mask against a transferred pattern is becoming large.

Next, with reference to FIG. 8, a conventional OPC correcting method for a mask will be described. FIG. 8 is a flow chart showing a procedure of a conventional OPC correcting method for a mask.

First of all, as shown in FIG. 8, at step $S_1$, a mask for extracting a process model, namely a test mask, is produced. The process model is a function model of which a simulated result of a transferred pattern of a photo mask using a function model matches a measured result of a transferred pattern of a test mask. Test masks are produced so that test patterns having various shapes, dimensions, and pitches that represent a circuit pattern of a real device are placed on test masks.

Thereafter, the flow advances to a test pattern transferring step, step $S_2$. At step $S_2$, process conditions such as an exposing condition of the exposing device, a resist process condition, and an etching process condition are set. A test mask is transferred to a wafer under the process conditions that have been set. The transferred test mask is processed. The transferred pattern is formed on the wafer.

Thereafter, at step $S_3$, the pattern dimensions of the transferred pattern formed on the wafer are measured by an SEM (Scanning Electron Microscope) or the like. Thereafter, at a process model extracting step, step $S_4$, a process model is created in accordance with the measured values of the pattern dimensions.

Thereafter, at a corrected mask producing step, step $S_5$, a corrected mask pattern that allows desired pattern dimensions and pattern shape to be obtained (extracted) after the test mask has been transferred and processed in accordance with the process model. A corrected mask is produced in accordance with the corrected mask pattern.

In the foregoing steps, a corrected mask that has been corrected by the OPC, namely a product mask, can be produced.

Thus, the OPC correction is performed by steps of production of test mask→transfer→measurement of dimensions→extraction of process model→obtainment of mask corrected values→production of corrected mask (product mask). The transferred pattern is measured with the corrected mask. As a result, the corrected mask is evaluated. Thus, the OPC correction for a mask is performed by complicated steps.

A conventional OPC correction for a mask is described in for example Japanese Patent Application Publication No. 2002-122977, pp 2-3.

In the low-k1 lithography used in recent years, the impact of the dimensional error of a pattern that takes place in production of a mask is becoming very large because a mask pattern should be more accurately transferred than before.

On the other hand, it is very difficult to produce a mask pattern of a photo mask in accordance with its design. The dimensions of a mask always contain a dimensional error of a pattern (tolerance). In particular, a problem to be solved is dependency of coarse/dense pattern or an error of line width depending on coarse/dense pattern.

As shown in FIG. 1, even if target line widths of mask patterns of photo masks are the same, the dimensional error of a pattern of dense lines is different from the dimensional error of a pattern of isolated lines. There is a tendency of which the dimensional error of a pattern of dense lines is larger than the dimensional error of a pattern of isolated lines.

For example, as reported with Proc. SPIE VOL. 4754 (2002) pp. 196-204, "Advanced pattern correction method for fabricating highly accurate reticles", although the dimensional error of a pattern of a mask mainly results from a drawing error of a mask pattern and an etching error at an etching step performed after a patterning step and a developing step have been performed, dimension fluctuating coarse/dense characteristic, namely an error of line width depending on coarse/dense pattern is becoming considered.

An error due to drawing in production of a mask is corrected by EB (electron beam) exposure amount correction. An error due to etching of a substrate performed after a drawing step and a developing step is corrected by a pattern correction. However, it is difficult to completely control the error of line width depending on coarse/dense pattern.

As conventional photo mask specifications, there are a means dimensional tolerance (mean to target) and evenness of line width on a plane. However, the error of line width depending on coarse/dense pattern has not been mentioned in a roadmap such as ITRS (International Technology Roadmap for Semiconductors).

However, as will be described in the following, an error of line width depending on coarse/dense pattern of a mask largely affects a transferred CD error of a transferred pattern.

So far, at an optical lithography step, dimensional errors of patterns of photo masks have not been largely concerned. However, in the low-k1 lithography used nowadays, it is considered that two photo masks produced in accordance with the same specifications have transferred CDs of transferred patterns that largely differ.

This is because a small difference between two photo masks with respect to an error of line width depending on coarse/dense pattern is emphasized by a large MEF of the low-k1 lithography used in recent years.

A characteristic of a transferred CD in the case that a pattern pitch of a mask pattern is varied, namely a graph showing the relation between a pattern pitch and a transferred CD, is referred to as an OPE (Optical Proximity Effect) curve. This characteristic is one of basic data from which a mask corrected value is obtained.

Thus, an OPE curve as basic data with which a mask is corrected is affected by both an optical proximity effect and an error of line width depending on coarse/dense pattern.

As described above, each of a mask pattern of a test mask and a mask pattern of a corrected mask contains an error of line width depending on coarse/dense pattern of a mask. Thus, the difference between a test mask and a corrected mask with respect to an error of line width depending on coarse/dense pattern becomes important.

At the process model extracting step, step $S_4$, assuming that a test mask has been produced in accordance with its design, a process model is produced. However, in reality, a mask pattern of a test mask contains an error of line width depending on coarse/dense pattern. Thus, since a process model that is produced contains a pattern dimension error, an error of line width depending on coarse/dense pattern of a test mask corresponding to an error of line width depending on coarse/dense pattern of a mask is propagated to a process model.

When a corrected mask having the same error depending on coarse/dense pattern as a test mask can be produced, the transferred CD error of the corrected mask can be decreased to almost zero. However, in reality, the difference between a test mask and a corrected mask with respect to an error of line width depending on coarse/dense pattern unavoidably takes place in the range of a production error. It is known that when a corrected mask is transferred, the difference between the masks is emphasized by the MEF as described above.

Thus, the difference between an error of line width depending on coarse/dense pattern of a test mask and an error of line width depending on coarse/dense pattern of a corrected mask, namely the difference between masks, affects the machining dimensions of the pattern of which the corrected mask is transferred. As a result, an unignorable error, namely, a mask corrected residual error, takes place in the transferred pattern.

As a result, it becomes difficult to obtain a transferred pattern having a high pattern dimensional control accuracy.

However, in the conventional mask correcting method using the OPC, the difference between masks is not specially considered. When a process model is produced by a test mask and a corrected photo mask corrected in accordance with the process model is produced, the influence of the difference between the test mask and the corrected photo mask with respect to the error of line width depending on coarse/dense pattern cannot be removed. The difference between the masks resides as an error element of the OPC corrected error. Thus, it becomes difficult to improve the correction accuracy.

Therefore, an object of the present invention is to provide a method for correcting a photo mask, namely a method for managing production of a mask that allows the difference between a test mask and a corrected mask with respect to an error of line width depending on coarse/dense pattern to be decreased when the photo masks are corrected by optical proximity effect correction.

DISCLOSURE OF THE INVENTION

The inventor thought about the following. In other words, to minimize the difference between a test mask and a corrected mask with respect to line width depending on coarse/dense, a mask having a line width depending on coarse/dense that is an intermediate value of a production error is used as a test mask.

In addition, in the range of which a process margin for which a corrected mask is transferred does not deteriorate, at least one of NA and a of an exposing device is finely adjusted so that an OPE curve is controlled and the difference between masks with respect to an error of line width depending on coarse/dense pattern is matched. As a result, a residual error on an OPE curve can be suppressed when a corrected mask is transferred. In this example, a represents a coherent factor and has a relation of σ=NA of lighting system/NA of object side of projection lens.

Form the foregoing, the inventor conceived a method for improving the correction accuracy of the OPC by finely adjusting one of NA and car of an exposing device, matching a test mask and a corrected mask, and removing the difference between the test mask and the corrected mask with respect to an error of line width depending on coarse/dense pattern.

In addition, the inventor confirmed that the obtained conception is effective with a simulated result and an experimented result. Finally, the inventor invented a method according to the present invention.

To accomplish the foregoing object, in accordance with the foregoing conception, the method for correcting a mask according to the present invention is a method for correcting a photo mask using an optical proximity effect correction method.

The method for correcting a mask comprises the steps of:
producing a test mask that functions as a mask for extracting a function model necessary for applying the optical proximity effect correction method so that a line width depending on coarse/dense is equal to or lower than a predetermined level and is an intermediate value of a production error;

transferring a mask pattern of the test mask on a wafer and measuring the dimensions of the transferred pattern;

obtaining a function model (referred to as process model) that allows a simulated result of the dimensions of the transferred pattern of the photo mask on the wafer matches a measured result obtained at the measuring step;

obtaining a mask pattern of which a transferred pattern matches a designed pattern using the process model and creating mask data in accordance with the obtained mask pattern;

producing a corrected mask in accordance with the created mask data in a producing condition of which an error of line width depending on coarse/dense pattern of the corrected mask matches that of the test mask in a predetermined range; and obtaining at least one of a numerical aperture (NA) and a coherence factor ($\sigma$) of an exposing device so that an OPE characteristic becomes flat in a predetermined range of a pattern pitch when the corrected mask is transferred.

According to the method of the present invention, at least one of a numerical aperture (NA) and a coherence factor ($\sigma$) of an exposing device that allow an OPE characteristic becomes flat in a predetermined range of a pattern pitch is obtained when a corrected mask is transferred. When the mask is exposed in those conditions, the difference between the test mask and the corrected mask with respect to an error of line width depending on coarse/dense pattern that resides in production of a mask can be suppressed in a predetermined range.

In the example, when ring-shaped lighting is performed, $\sigma$ is composed of inner $\sigma$ and outer $\sigma$. The inner $\sigma$ is $\sigma$ inside a ring-shaped light source, whereas the outer $\sigma$ is $\sigma$ outside the ring-shaped light source.

At the test mask producing step of a preferred embodiment of the present invention, a test mask is produced in a mask producing condition of which an error of line width depending on coarse/dense pattern of the test mask can be restricted in an allowable range and that the error of line width depending on coarse/dense pattern is an intermediate value of the production error. The mask producing condition of the test mask is obtained through an experiment or a simulation calculation. Thus, a mask of which an error of line width depending on coarse/dense pattern is restricted in the allowable range and is an intermediate value of the production error can be used as a test mask.

At the corrected mask producing step, a corrected mask is produced in a mask producing condition of which the difference between the test mask and the corrected mask with respect to an error of line width depending on coarse/dense pattern is in the predetermined range. The mask producing condition of the corrected mask is obtained through an experiment or a simulation calculation. Since mask data is extracted from a process model and the corrected mask is produced in the mask producing condition in accordance with the mask data, most of the influence of the difference between the masks can be removed.

In addition, at the exposing condition setting step, the influence of the difference between the test mask and the corrected mask with respect to the error depending on coarse/dense pattern is cancelled in accordance with the error of line width depending on coarse/dense pattern of the test mask. Thus, NA and $\alpha$ of the exposing device are finely adjusted so that the OPE curve of which the corrected mask is transferred becomes the flattest. Thus, the difference between the corrected mask and the test mask that slightly resides at the corrected mask producing step can be removed.

The basic concept of the method according to the present invention is as follows.

(1) To cause the production error of the mask due to coarse/dense pattern to be lower than an allowable level, an allowable range of an error of line width depending on coarse/dense pattern of a test mask is set. In addition, a mask having an error depending on coarse/dense pattern that is an intermediate value of the production error is used as a test mask. Thus, a dimensional error of a pattern propagated to a transferred pattern on a wafer due to an error of line width depending on coarse/dense pattern of a test mask can be restricted in an allowable level.

(2) An error of line width depending on coarse/dense pattern of a test mask is matched with that of a corrected mask in a predetermined range. Thus, the error of line width depending on coarse/dense pattern of the corrected mask is reproduced as the error of line width depending on coarse/dense pattern of the test mask in the predetermined range. As a result, a dimensional error of a pattern on a wafer due to the difference between masks can be restricted in the predetermined range.

(3) In (2), although an error of line width depending on coarse/dense pattern of a corrected mask matches an error of line width depending on coarse/dense pattern of a test mask in a predetermined range, the difference between the corrected mask and the test mask with respect to the error depending on coarse/dense pattern slightly resides. Thus, at least one of NA and $\sigma$ of an exposing device is adjusted so that the test mask and the corrected mask are matched and the residual difference between the masks becomes zero. In addition, as the result of (2), when the residual difference between the masks is removed, the dimensional error of the transferred pattern on the wafer can be further decreased.

Next, the foregoing basic concept will be described in detail.

Description of (1)

As described above, when a test mask is produced, a dimensional error of a pattern takes place depending on whether the pattern is coarse or dense. When a test mask is patterned, the etching rate of quartz that composes a mask substrate in a dense region having dense lines (dense line region) is lower than that in an isolation region having isolated lines (isolated line region). As a result, as shown in FIG. 1, the line width of a pattern in the dense region is apt to be larger than that in the isolation region.

FIG. 1 is a graph showing a typical relation between a wide/narrow pitch and a production error of a mask. In FIG. 1, a production error of a mask is measured in the manner that the line width of the line pattern is fixed and the pattern pitch is varied from a narrow pitch to a wide pitch.

For simplicity, with reference to FIG. 2, transferred CDs of photo masks having a dense pitch (dense lines) and an isolation pitch (isolated lines) will be described. FIG. 2 is a graph showing a relation between a pattern pitch and a transferred CD with a parameter of an error of line width depending on coarse/dense pattern. Graph (1) is an OPE graph when an error of line width depending on coarse/dense pattern $\Delta M$ is zero. In other words, graph (1) represents an optical proximity effect to be extracted. Graph (2) is an OPE graph when a mask having an error of line width depending on coarse/dense pattern $\Delta M$ is transferred.

In the graphs, the error of line width depending on coarse/dense pattern ΔM is expressed by the following formula.

$$\Delta M = D_E - I_E$$

where $D_E$: production error of mask having dense pitch $I_E$: production error of mask having isolation pitch When the OPE graph (1) and the OPE graph (2) shown in FIG. 2 are compared, the transferred CD of dense pitch in the case that the error of line width depending on coarse/dense pattern is ΔM is larger than the transferred CD of the dense pitch in the case that the error of line width depending on coarse/dense pattern is zero by MEFd×ΔM. In other words, the transferred CD is emphasized by MEFd×ΔM in comparison with the case of ΔM=0. In this case, MEFd represents MEF in the case that a pattern has a dense pitch.

Thus, since the OPE curve (2) of the test mask having an error of line width depending on coarse/dense pattern deviates from the OPE curve (1) of an ideal mask that does not have an error of line width depending on coarse/dense pattern, the former has an error.

Consequently, when the test mask has an error of line width depending on coarse/dense pattern, the calculated corrected value of the mask contains an error. The error is propagated to the dimensions of a transferred pattern of a corrected mask.

FIG. 3 is a graph showing an influence of an error of line width depending on coarse/dense pattern of a test mask against a dimensional error of a transferred CD of a corrected mask. FIG. 3 shows a simulated result of which a transferred CD error of a corrected mask in the case that the difference between the test mask and the corrected mask with respect to an error of line width depending on coarse/dense pattern is zero. The simulation is performed in the following conditions.

Mask: halftone phase shift mask having a transmissivity of 6%.

Patterns of test mask

Ideal mask: isolated lines having a width of 140 nm and dense lines having a width of 140 nm and a pitch of 260 nm.

Real mask: isolated lines having a width of 140 nm and dense lines having a width of 140 nm+ΔM and a pitch of 260 nm where ΔM represents an error of line width depending on coarse/dense pattern of the test mask. As represented by the horizontal axis of FIG. 3, ΔM is a parameter that varies from −6 nm to +8 nm.

Target value of transferred CD: isolated line having a width of 110 nm and dense lines having a width of 110 nm and a pitch of 260 nm.

Exposing condition: exposure light/ArF, NA=0.60, σ=0.75, ⅔ ring shape

A process supposed in the simulation deals with a standard ArF resist having a contrast γ of 10 and a diffusion length of 30 nm.

FIG. 4 is a table showing calculated data of the graph shown in FIG. 3. FIG. 4 shows a calculated result of a simulation of transferred CD errors of corrected masks in the case that errors of line width depending on coarse/dense pattern of test masks are varied.

FIG. 3 and FIG. 4 show that even if the difference between the test mask and the corrected mask with respect to the error of line width depending on coarse/dense pattern is zero, the line width of the corrected mask does not become 127 nm (line width of a pattern having a pitch of 260 nm of the corrected mask calculated when the error of line width depending on coarse/dense pattern of the test mask is zero). Instead, a small error takes place in accordance with the error of line width depending on coarse/dense pattern of the test mask. When the corrected mask is transferred, the small error is emphasized by the MEF. Thus, as shown in FIG. 3, it is clear that an unignorable error resides in the line width of the pattern transferred to the wafer.

It is thought that when the error of line width depending on coarse/dense pattern of the test mask is relatively large, the linearity of the mask correcting system is not fully maintained.

Description about (2)

As shown in FIG. 1, since the difference between the test mask and the corrected mask with respect to the error of line width depending on coarse/dense pattern is emphasized by the MEF and affects the line width of the transferred pattern of the corrected mask, it is important to manage the difference between the masks.

In other words, to produce a corrected mask, it is necessary to manage the difference between the masks based on the error of line width depending on coarse/dense pattern of the test mask. In addition, when the production error is considered, it is desired that the error depending on coarse/dense pattern of the test mask should be an intermediate value of the production error.

Description about (3)

FIG. 5 shows a simulated result of transferred CDs of two masks that are an ideal mask (mask A) of which an error of line width depending on coarse/dense pattern ΔM is zero and a nearly real mask of which ΔM is 2 nm on a wafer (mask B). For the masks A and B, a process model is extracted with a test mask of which an error of line width depending on coarse/dense pattern is zero. As shown in FIG. 9, after the corrected mask is transferred, the line dimensions of the corrected mask is calculated for each pitch in the condition that the through-pitch is 110 nm. FIG. 9 is a graph showing a corrected value of a mask in the through-pitch.

Assuming that a mask having an error of line width depending on coarse/dense pattern ΔM of zero (mask A) and a mask having an error of line width depending on coarse/dense pattern ΔM of 2 nm (mask B), their transferred CDs are calculated. FIG. 10 shows an error of line width depending on coarse/dense pattern of the mask B used for the evaluation.

FIG. 5 shows that in the initial state of which the pitch is small, since the error of line width depending on coarse/dense pattern of the mask is emphasized by the MEF with respect to each pitch and line width, the OPE curve of the mask B largely deviates from the OPE curve of the mask A. It is clear that as the pitch becomes large, namely when the pitch exceeds around 500 nm, the OPE curve of the mask A almost matches the OPE curve of the mask B.

When the numerical aperture (NA) of the exposing device is slightly varied, for example NA is changed from 0.60 to 0.58, the OPE curve of the mask B can be matched with the OPE curve of the mask A.

FIG. 6 shows a graph of a simulated result of which masks are matched by finely adjusting NA of the exposing device. FIG. 6 shows OPE curves of the masks A and B that are exposed with NA=0.59 and 0.58 as well as OPE curves of the mask A and the mask B that are exposed with NA=0.60.

From FIG. 6, it is clear that when NA is slightly varied, the difference between the mask A and the mask B with respect to the error of line width depending on coarse/dense pattern can be almost removed.

As described above, in the method according to the present invention, when at least one of NA and σ is slightly varied, the difference between a test mask and a corrected mask with respect to an error of line width depending on coarse/dense pattern can be removed unlike the conventional mask correcting method using the OPC.

Thus, the dimensional error of a transferred pattern on a wafer due to the difference between a test mask and a corrected mask with respect to the error of line width depending on coarse/dense pattern can be remarkably decreased.

BRIEF DESCRIPTION OF DRAWINGS

FIG. 10 is a graph showing an error of line width depending on coarse/dense pattern of a mask B (on a wafer).

BEST MODE FOR CARRYING OUT THE INVENTION

Next, with reference to the accompanying drawings, an embodiment of the present invention will be described practically and in detail.

EMBODIMENT

Figure 7:
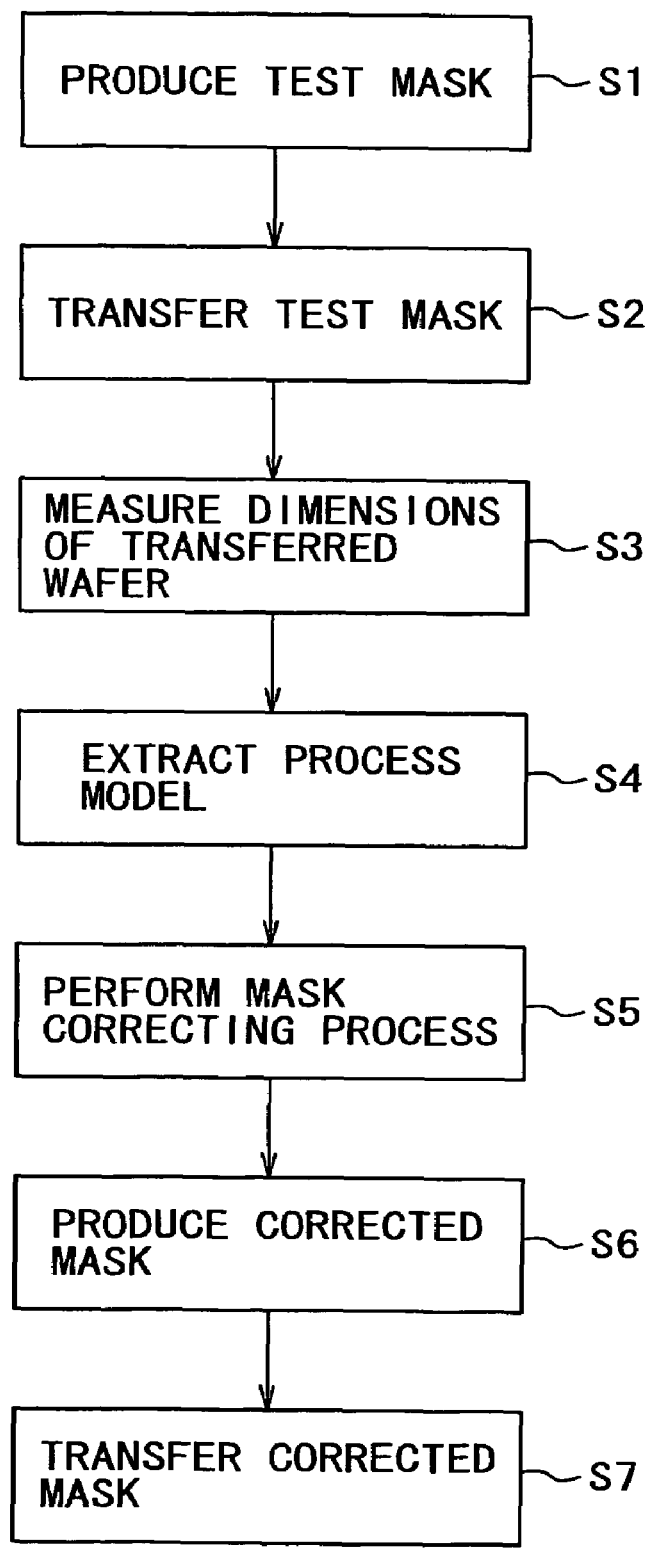
FIG. 7 is a flow chart showing a procedure of a mask correcting method according to an embodiment.
Figure 8:
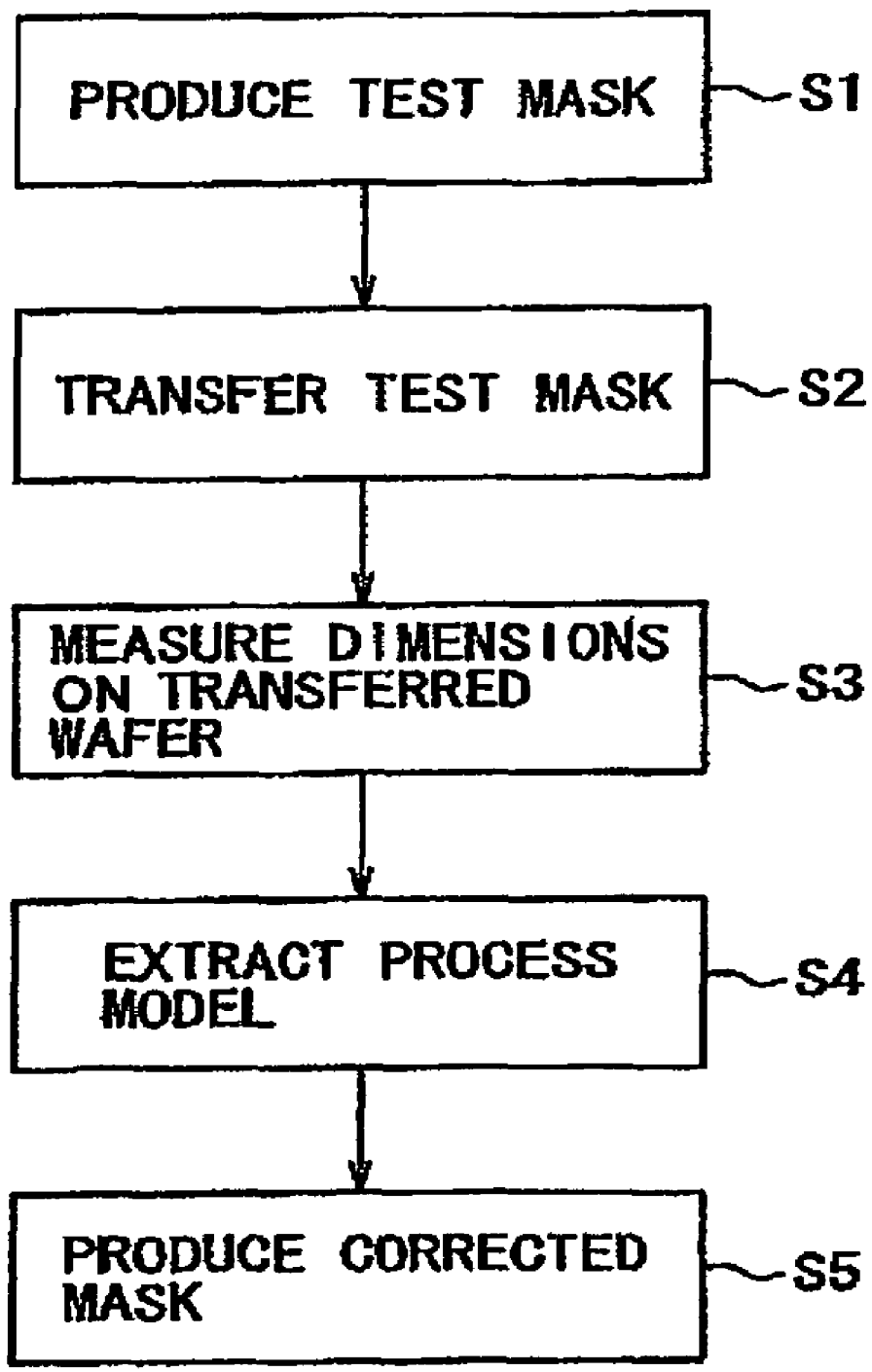
FIG. 8 is a flow chart showing a procedure of a conventional mask correcting method.
Figure 9:
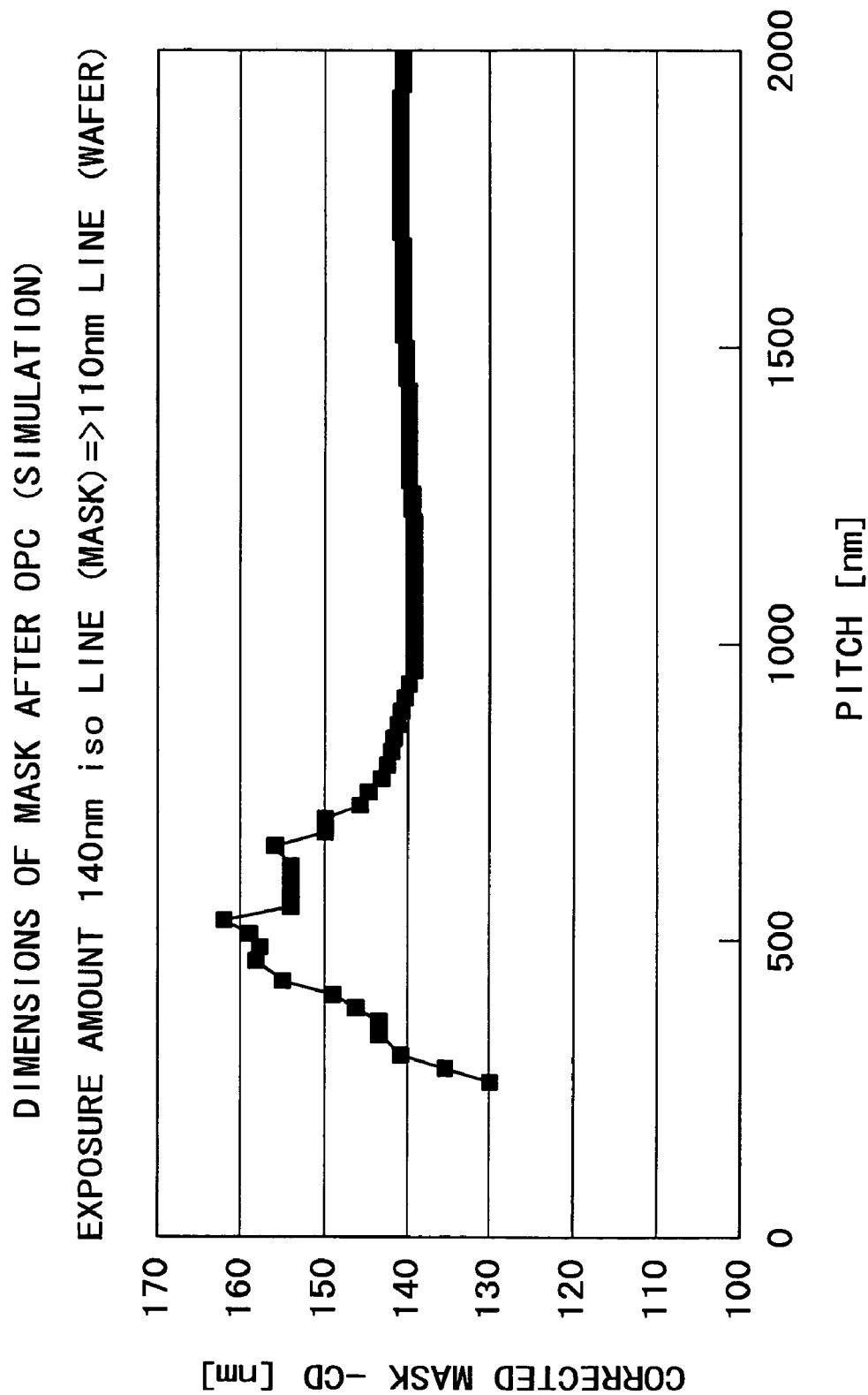
FIG. 9 is a graph showing dimensions of a mask for which OPC has been performed in accordance with the relation of a pitch and a CD of a corrected mask.

The embodiment is an example of a mask correcting method according to the present invention. FIG. 7 is a flow chart showing a procedure of the mask correcting method according to the embodiment.

Figure 1:
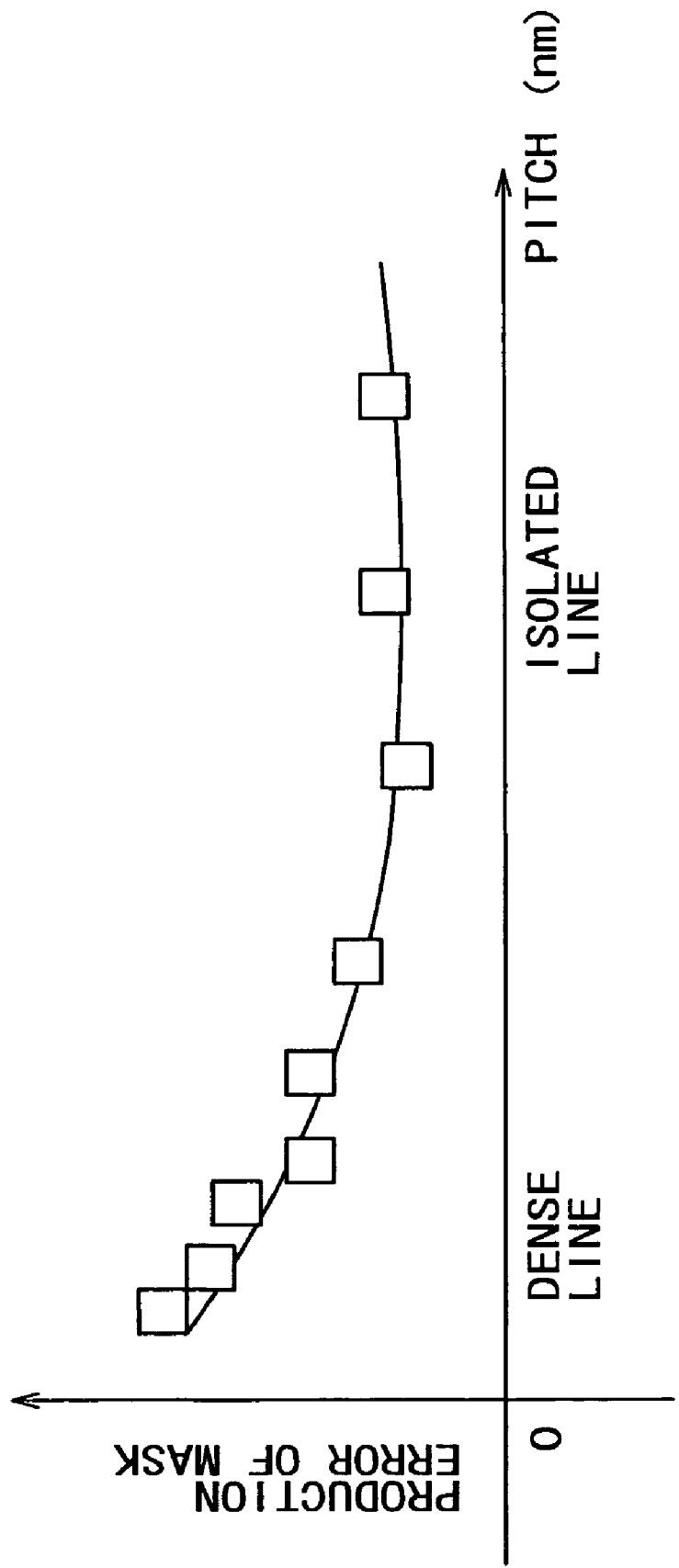
FIG. 1 is a graph showing a typical relation between wide and narrow pitches and a production error of a mask.
Figure 2:
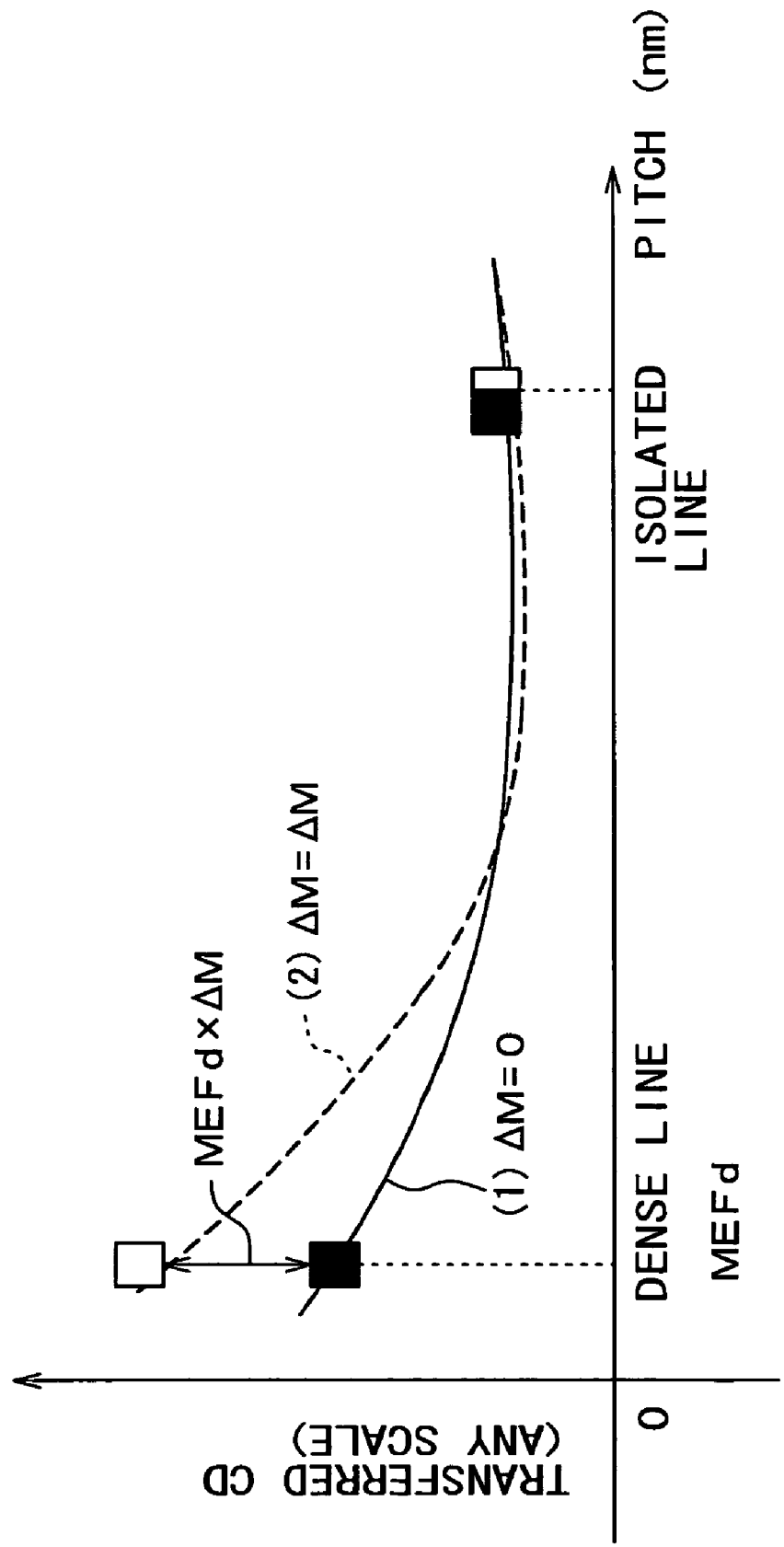
FIG. 2 is a graph schematically showing a relation between a pattern pitch and a transferred CD with a parameter of an error of line width depending on coarse/dense pattern of a mask, namely a so-called OPE graph.
Figures 3, 4:
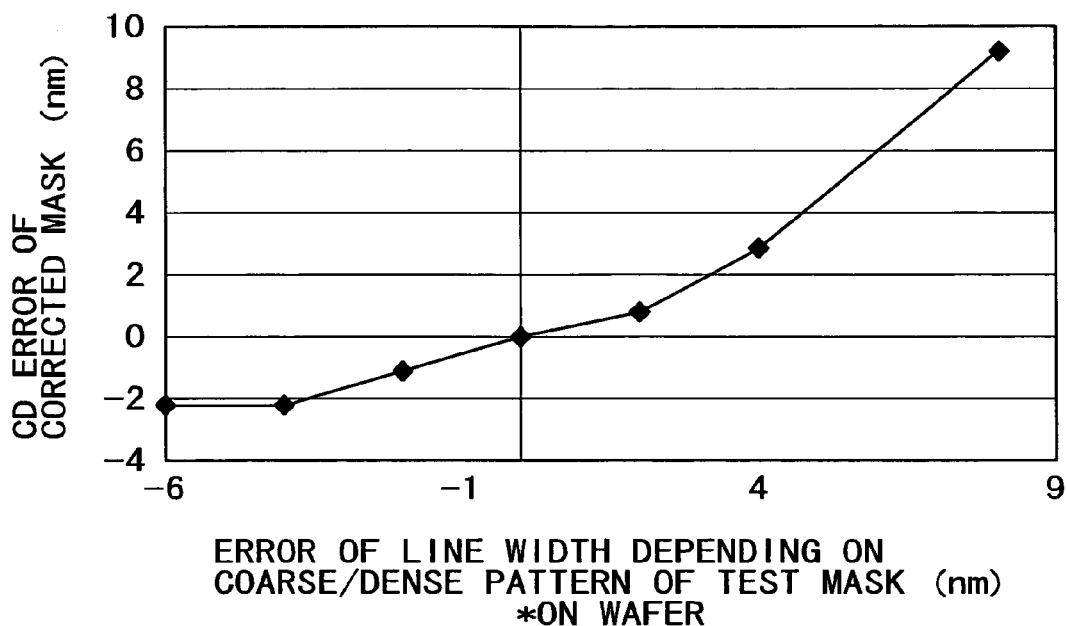
FIG. 3 is a graph showing influence of an error of line width depending on coarse/dense pattern of a test mask against a transferred CD of a transferred corrected mask.
FIG. 4 is a table of data of the graph shown in FIG. 3.
Figure 5:
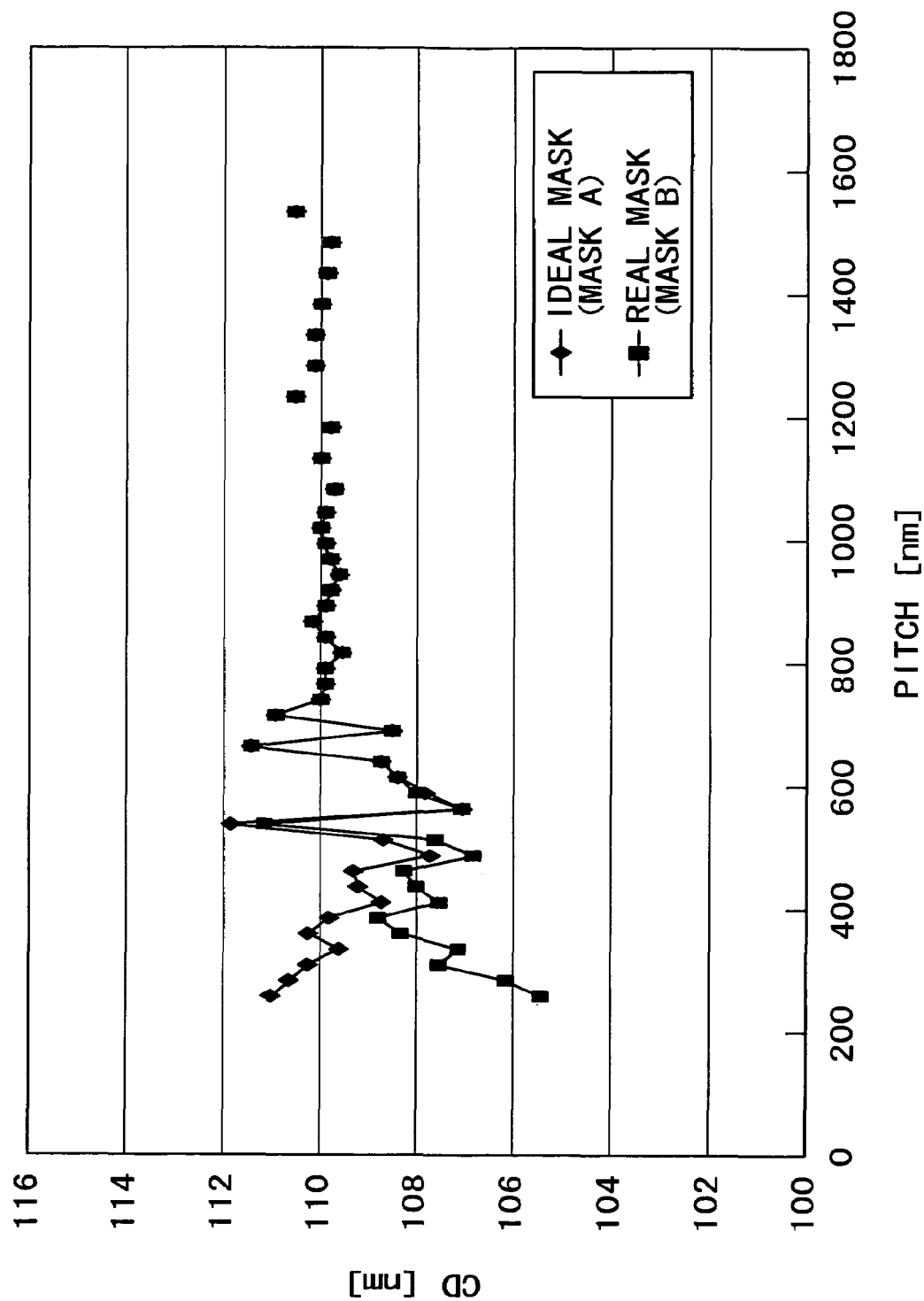
FIG. 5 shows OPE curves of simulated results of transferred CDs of two corrected masks of an ideal mask (mask A) of which an error of line width depending on coarse/dense pattern ΔM of a corrected mask is zero and a nearly real mask (mask B) of which ΔM is 2 nm.
Figure 6:
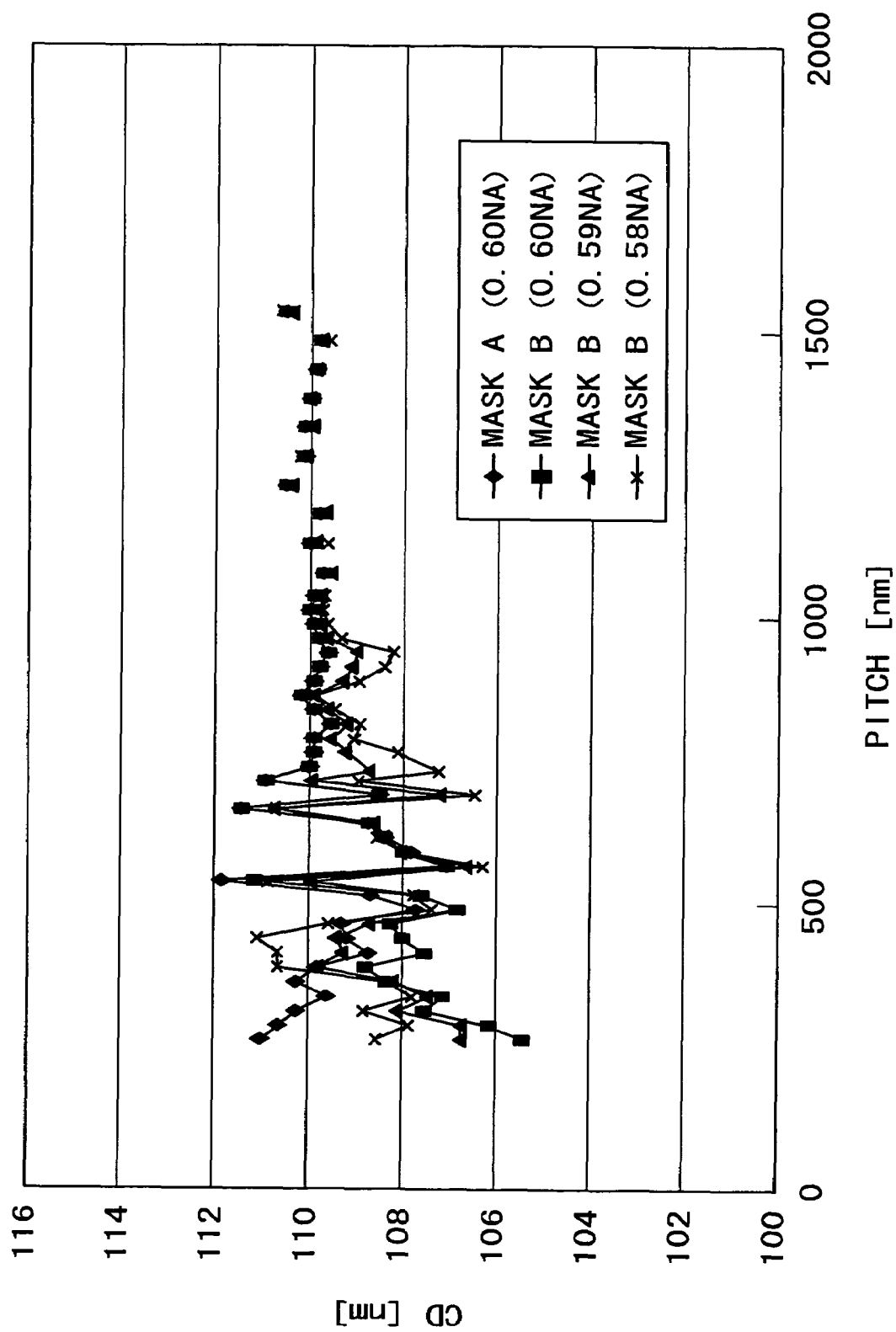
FIG. 6 shows OPE curves of simulated results of which masks are matched by finely adjusting NA of an exposing device.

First of all, at a test mask producing step, step $S_1$, a test mask is produced. The test mask is a mask that functions as a mask for extracting a process model corresponding to the optical proximity effect correction. When the test mask is produced, an allowable range of an error of line width depending on coarse/dense pattern is set in accordance with an analyzed result shown in FIG. 3. Thereafter, a mask producing condition is set so that the error of line width depending on coarse/dense pattern of the test mask is restricted in the allowable range. The test mask is produced in the mask producing condition.

The mask producing condition for which the test mask is produced the same as a mask producing condition for which the error of line width depending on coarse/dense pattern of a corrected mask produced at step $S_5$ is restricted in the allowable rang. In other words, it is preferred that the error of line width depending on coarse/dense pattern is an intermediate value of the production error.

Thereafter, the flow advances to a test mask transferring step, step $S_2$. At step $S_2$, a mask pattern of the test mask is transferred to a wafer in the same transfer condition as a real photo mask.

Thereafter, the flow advances to a transfer wafer measuring step, step $S_3$. At step $S_3$, the dimensions of the transferred pattern transferred on the wafer are measured by CD-SEM or the like.

Thereafter, the flow advances to a process model extracting step, step $S_4$. At step $S_4$, a function model of which a simulated result of a transferred pattern of a mask pattern of a photo mask using a general purpose OPC simulator matches the measured result at step $S_3$, namely a so-called process model, is extracted or obtained. Thus, the transferred pattern of the mask pattern of the photo mask simulated in accordance with the process model by the general-purpose OPC simulator becomes the transferred pattern corresponding to the measured result obtained at step $S_3$.

Thereafter, the flow advances to a mask correcting step, step $S_5$. At step $S_5$, a mask pattern that matches a designed pattern is obtained using the process model obtained at step $S_4$ by the foregoing general-purpose simulator. As a result, mask CAD data for the mask to be produced is created.

Thereafter, the follow advances to a corrected mask producing step, step $S_5$. At step $S_5$, a corrected mask is produced in accordance with the created mask CAD data.

When a corrected mask is produced, it is produced in a mask producing condition of which an error of line width depending on coarse/dense pattern of the corrected mask matches an error of line width depending on coarse/dense pattern of the test mask in a predetermined range.

Thereafter, the flow advances to a corrected mask transferring step, step $S_7$. At step $S_7$, OPE curves are matched by adjusting the exposing condition of the exposing device.

Since the test mask and the corrected mask are produced in the foregoing mask producing condition, although errors of line width depending on coarse/dense pattern of the masks match in the predetermined range, since the difference between the masks with respect to the error of line width depending on coarse/dense pattern due to the reproducibility of the optical lithography process resides, the error of line width depending on coarse/dense pattern of the test mask is slightly different from that of the corrected mask.

Thus, at step $S_7$, by slightly varying the numerical aperture (NA) and coherent factor (σin, σout) of the exposing device in an allowable range of a lithography margin composed of a focus margin and an exposure amount margin, the corrected mask is transferred. As a result, an exposing condition is obtained so that the OPE curve of the transferred CD becomes flat with respect of wide and narrow pitches.

When the corrected mask is transferred in accordance with the obtained exposing condition, the difference between the masks with respect to the error of line width depending on coarse/dense pattern can be almost removed.

According to the present invention, when the corrected mask corrected by the OPC method is transferred, at least one of the numerical aperture (NA) and the coherence factor (σ) of the exposing device that allow the OPE characteristic to be flat in the predetermined range of the pattern pitch is obtained. In the obtained condition, the mask is exposed. As a result, the difference between the test mask and the corrected mask with respect to the error of line width depending on coarse/dense pattern that resides in production of masks can be suppressed in the predetermined range.

When a test mask is produced in the mask producing condition of which an error of line width depending on coarse/dense pattern of the test mask is restricted in the allowable range, the test mask is used, a process model is extracted using the test mask, and the line width of the corrected mask is calculated in accordance with the process model, the error of line width depending on coarse/dense pattern of the transferred pattern of the corrected mask can be restricted in the allowable range.

When a corrected mask is produced in the mask producing condition of which the difference between the test mask and the corrected mask with respect to the error of line width depending on coarse/dense pattern is restricted in the allowable range, the most of the difference between the test mask and the corrected mask with respect to the error of line width depending on coarse/dense pattern can be removed.

In addition, at the exposing condition setting step, at least one of NA and σ of the exposing device is slightly varied so that the process margin does not deteriorate and when the corrected mask is transferred, a residual error of the OPE curve becomes minimum for all pitches. Thus, when the test mask and the corrected mask are matched on the basis of the error of line width depending on coarse/dense pattern of the test mask and the difference between the test mask and the corrected mask with respect to the error of line width depending on coarse/dense pattern is removed, the difference slightly resides between the masks at the producing step of the corrected mask can be removed. Thus, the correction accuracy of the mask can be remarkably improved.

The invention claimed is:

1. A method for correcting a photo mask using an optical proximity effect correction method, said method for correcting a photo mask comprising the steps of:

producing a test mask;

transferring a mask pattern of said test mask on a wafer and measuring dimensions of a transferred pattern;

obtaining a model that simulates a result of the measured transferred pattern of said photo mask on said wafer;

obtaining a corrected mask pattern which matches a designed pattern by using said model; and selectively setting an exposing condition to alter at least one of a numerical aperture (NA) and a coherence factor (σ) of an exposing device depending upon a pattern pitch of a region where said corrected mask is transferred.

2. A method for correcting a photo mask according to claim 1, wherein at said step of producing a test mask, said test mask is produced in a mask producing condition of which an error of line width depending on coarse/dense pattern of said test mask is limited in a predetermined range.

3. A method for correcting a photo mask according to claim 2, wherein at said step of producing a corrected mask, said corrected mask is produced in a mask producing condition of which the difference between said test mask and said corrected mask with respect to an error of line width depending on coarse/dense pattern is in the predetermined range.

4. A method for correcting a photo mask according to claim 1, wherein at said step of setting the exposing condition, at least one of NA and σ of an exposing device is adjusted so that the OPE curve of which the corrected mask is transferred becomes the flattest over all the pitches, and that the difference between the corrected mask and the test mask with respect to the error depending on coarse/dense pattern is reduced.

* * * * *